(12) United States Patent
Morinaga et al.

(10) Patent No.: US 7,704,790 B2
(45) Date of Patent: Apr. 27, 2010

(54) METHOD OF MANUFACTURING A CARRIER MEMBER FOR ELECTRONIC COMPONENTS

(75) Inventors: Yuichi Morinaga, Tokyo (JP); Hisao Yamagata, Tokyo (JP); Toru Makanae, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 678 days.

(21) Appl. No.: 11/454,086

(22) Filed: Jun. 16, 2006

(65) Prior Publication Data

US 2006/0283467 A1 Dec. 21, 2006

(30) Foreign Application Priority Data

Jun. 17, 2005 (JP) ............................. 2005-178528

(51) Int. Cl.
*H01L 21/44* (2006.01)
*H01L 21/48* (2006.01)
*H01L 21/50* (2006.01)
*H01L 21/30* (2006.01)
*H01L 21/46* (2006.01)

(52) U.S. Cl. ........................ 438/106; 438/108; 438/458

(58) Field of Classification Search ................. 438/110, 438/458, 222, 689, 127, 118, 464, 106, 108
See application file for complete search history.

(56) References Cited

U.S. PATENT DOCUMENTS

| 6,635,968 | B2 | 10/2003 | Usami | |
|---|---|---|---|---|
| 6,951,596 | B2 * | 10/2005 | Green et al. | ................. 156/264 |
| 7,224,280 | B2 * | 5/2007 | Ferguson et al. | ......... 340/572.7 |

FOREIGN PATENT DOCUMENTS

| JP | 2001-217380 | 8/2001 |
|---|---|---|
| JP | 2004-355469 | 12/2004 |

* cited by examiner

*Primary Examiner*—Chuong A. Luu
(74) *Attorney, Agent, or Firm*—Mattingly & Malur, P.C.

(57) ABSTRACT

Plural inlets 1 are formed by a separation into individual pieces, and these plural inlets are arranged to a tape-like carrier such that the long side of each of the plural inlets is along the longitudinal direction of the tape-like carrier, whereby cost can be reduced by rearranging the inlets to the cheap tape-like carrier. Further, the plural inlets formed by separating into individual pieces are rearranged onto the tape-like carrier, whereby the change of the arrangement pitch of the inlets so as to correspond to the size of a final product at a customer side can be facilitated, and days taken for the development for newly supplying the inlets can be shortened.

6 Claims, 18 Drawing Sheets

METHOD OF MANUFACTURING A CARRIER MEMBER FOR ELECTRONIC COMPONENTS

CROSS-REFERENCE TO RELATED APPLICATION

The present application claims priority from Japanese patent application No. 2005-178528 filed on Jun. 17, 2005, the content of which is hereby incorporated by reference into this application.

BACKGROUND OF THE INVENTION

The present invention relates to a technique of manufacturing a carrier member, and more particularly to a technique effective to be applied to a carrier member for electronic components for carrying electronic components such as inlets.

In a method for manufacturing a semiconductor device, an adhesive resin is adhered beforehand on a thin chip, and then, the thin chip is sandwiched by electrode-mounted film substrates which are symmetrically designed and on which an antenna is formed, whereby the thin chip and the electrode of the film substrate are connected (e.g., Patent Reference 1)

Further, an inlet for an electronic tag has an antenna made of Cu film adhered onto a one face of a rectangular insulating film made of a polyimide resin film, and a semiconductor chip connected to this antenna (see Patent Reference 2).

[Patent Reference 1]
Japanese Unexamined Patent Publication No. 2001-217380 (FIG. 2)

[Patent Reference 2]
Japanese Unexamined Patent Publication No. 2004-355469 (FIG. 29)

SUMMARY OF THE INVENTION

An RFID (Radio Frequency Identification) inlet (hereinafter referred simply to as an "inlet") mounted on a non-contact type electronic tag or the like is an electronic component having, for example, a semiconductor chip provided with a memory circuit and communication circuit, and a microantenna.

The present inventors have examined the technique of manufacturing a carrier member for an RFID inlet. FIGS. 27 to 31 show comparative examples examined by the present inventors.

FIGS. 27 and 28 show a structure of an RFID inlet of a comparative example, and FIG. 29 shows a supplying manner of the RFID inlet of the comparative example. As shown in FIGS. 27 and 28, in an inlet 400, a semiconductor chip 100 for an RFID is connected, via bumps 600 (e.g., made of soldering, etc.), to an antenna 300 (e.g., made of an aluminum foil, etc.) formed on a base film 200 made of a polyimide resin or the like.

Further, the circuit face of the semiconductor chip 100 and the bonding section between the bump 600 and the antenna 300 are sealed and protected by underfill resin 500.

FIG. 29 shows a supplying manner of the inlet 400. The inlet 400 arranged on the base film 200 is rolled around a reel 700 that is for supplying the inlet, and shipped.

FIGS. 30 and 31 show a method of manufacturing an RFID tag 920 according to a comparative example in which the inlet 400 is inserted into a paper. FIG. 30 shows a dicing-mounting method, wherein the inlet 400 drawn out of the reel 700 for supplying the inlet is cut into pieces together with the base film 200 by a cutting edge 800 or the like, so that an individual inlet 400 is obtained. The inlet 400 that is cut into individual piece is mounted on a tag paper (lower side) 900 with an adhesive, and then, a tag paper (upper side) 910 is bonded to complete the manufacture of the RFID tag 920 having inserted therein the inlet 400.

On the other hand, FIG. 31 shows a sandwiching method, wherein the inlet 400 drawn out of the reel 700 for supplying the inlet is inserted between the tag paper (lower side) 900 and the tag paper (upper side) 910 supplied from a paper roll 930 as mounted on the base film 200, and then, the entire of the resultant is bonded by an adhesive or the like by using a pressure roller 940, etc. Thereafter, the resultant is wound around an RFID tag roll 950 in a roll, or cut into individual piece for every product by the cutting edge 800.

Meanwhile, the dicing-mounting method shown in FIG. 30 entails a problem of a processing speed being low and a problem of increased cost, since this method requires to carry and mount the inlet 400 as positioned on the tag paper (lower side) 900 individually.

On the other hand, in the sandwiching method shown in FIG. 31, it is necessary to make the arrangement pitch of the inlet 400 on the base film 200 great, and to change the same pitch for every product, according to the size of the RFID tag 920 that is a final product. In this case, the antenna 300 is generally formed such that a resist or the like is adhered onto the member obtained by bonding a metal foil and the base film 200 to each other, and etching is performed to the resultant. Therefore, as the arrangement pitch is increased, the number of the inlet 400 that is to be taken out is decreased, which entails a problem of the increased material cost for the base film 200 and the expensive metal foil. Further, every time the arrangement pitch is changed, a new manufacture and days for development are required for a mask for etching or the like, which entails a problem of the delivery date, that is the date when the product can be supplied, being prolonged.

Note that the Patent Reference 1 has a disclosure of "when the inlet is shipped, it is delivered in a roll shape", but it has no disclosure that plural inlets that are separated into individual pieces are rearranged onto another carrier.

Further, the Patent Reference 2 discloses that plural inlets are arranged and formed on an insulating film such that the short side of the inlet is along the longitudinal direction of the film (FIGS. 12 and 13 in Patent Reference 2), this insulating film is packaged as wound around a reel (FIG. 20 in Patent Reference 2), and the resultant is shipped to a customer. However, it has no disclosure that plural inlets that are separated into individual pieces are rearranged onto another carrier.

An object of the present invention is to provide a technique that makes it possible to reduce cost in a method of manufacturing a carrier member for electronic components.

Another object of the present invention is to provide a technique that makes it possible to shorten days taken for a development in a method of manufacturing a carrier member for electronic components.

The foregoing and other objects and novel features of the invention will be apparent from the description in the specification and appended drawings.

A brief description will be given to the outline of the representative aspects of the present invention disclosed in the present application.

The present invention comprises a step of forming plural inlets; and a step of arranging the plural inlets on the tape-like carrier such that the long side of each of the plural inlets is along the longitudinal direction of the tape-like carrier.

The present invention comprises a step of forming plural inlets; and a step of arranging the plural inlets on a tape-like carrier with a pitch corresponding to the pitch upon mounting the inlets at a customer side.

A brief description will be given to the effects obtained by the representative aspects of the present invention disclosed in the present application.

Plural inlets are formed, and they are arranged on the tape-like carrier such that each long side of each of these plural inlets is along the longitudinal direction of the tape-like carrier, whereby cost can be reduced by rearranging the inlets on a cheap tape-like carrier.

Further, plural inlets are rearranged on the tape-like carrier, so that the arrangement pitch is easily changed so as to correspond to the size of the final product (RFID tag, etc.) at a customer, and further, the days for a development taken for newly supplying inlets can be shortened.

DETAILED DESCRIPTION OF THE PREFERRED EMBODIMENTS

Figure 1:
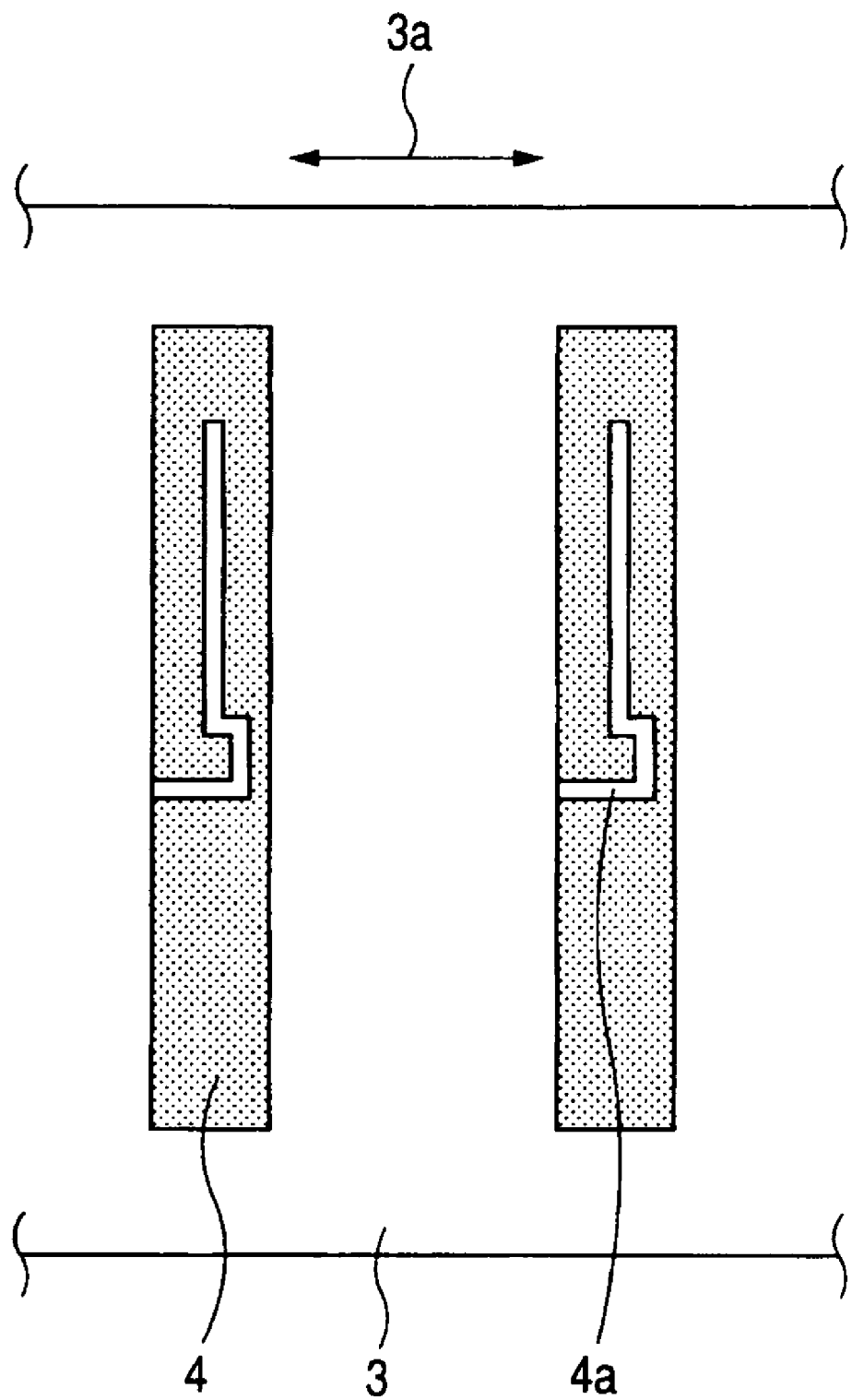
FIG. 1 is a partial plan view showing one example of a structure of a tape-like substrate with an antenna pattern prepared for a manufacture of a carrier member for electronic components according to the embodiment of the present invention.

In the following embodiments, explanations of the same or similar portions will not be repeated in principle except when particularly required.

In the following embodiments, descriptions will be made separately to plural sections or embodiments when required. Unless otherwise stated, they are not independent of each other, and one is dependent partially or wholly on others in terms of variants, details, additional descriptions, and the like.

In the embodiments below, the number of elements (including count, numeric value, quantity, and range), when designated, are not limited to the designated number and may be around the designated number, except in cases where it is explicitly specified and cases where it is theoretically limited to the specific number.

The present invention will be explained in detail with reference to drawings. In all drawings for explaining the embodiments, elements having identical functions are identified by the same reference numerals and duplicate descriptions of them are omitted.

Embodiment

Figure 2:
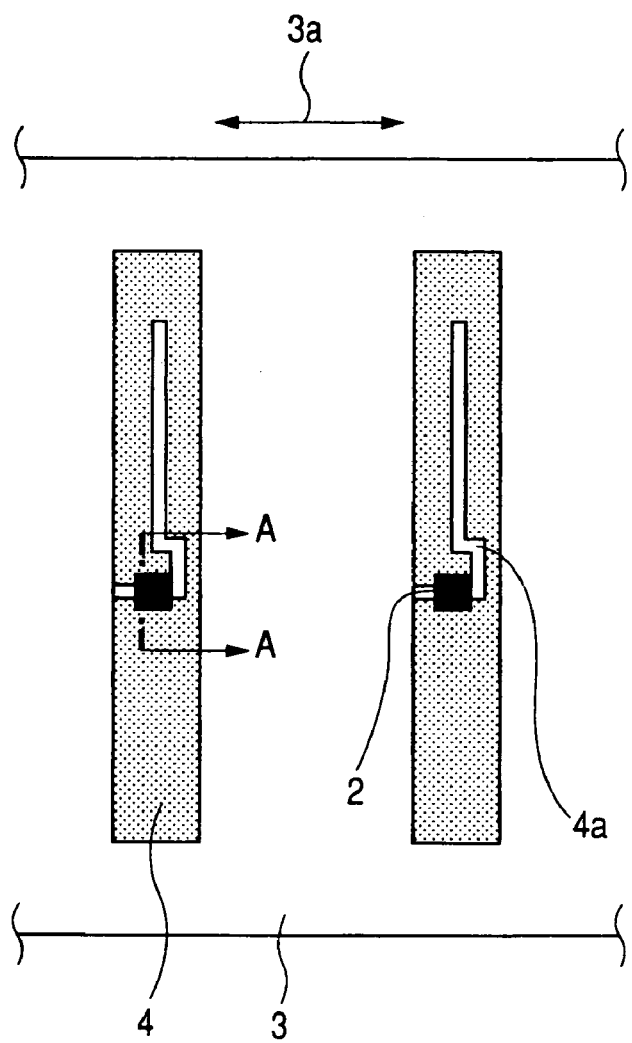
FIG. 2 is a partial plan view showing one example of a structure after chips are mounted in the manufacture of the carrier member for electronic components according to the embodiment of the present invention.
Figure 3:
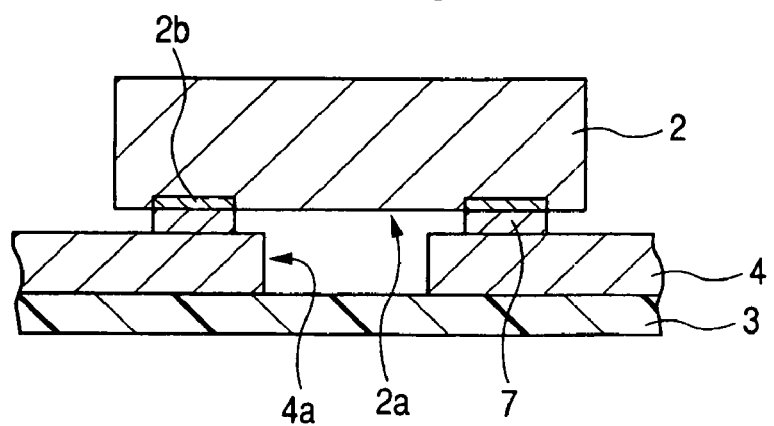
FIG. 3 is a partial sectional view showing a structure of a section cut along a line of A-A in FIG. 2.
Figure 4:
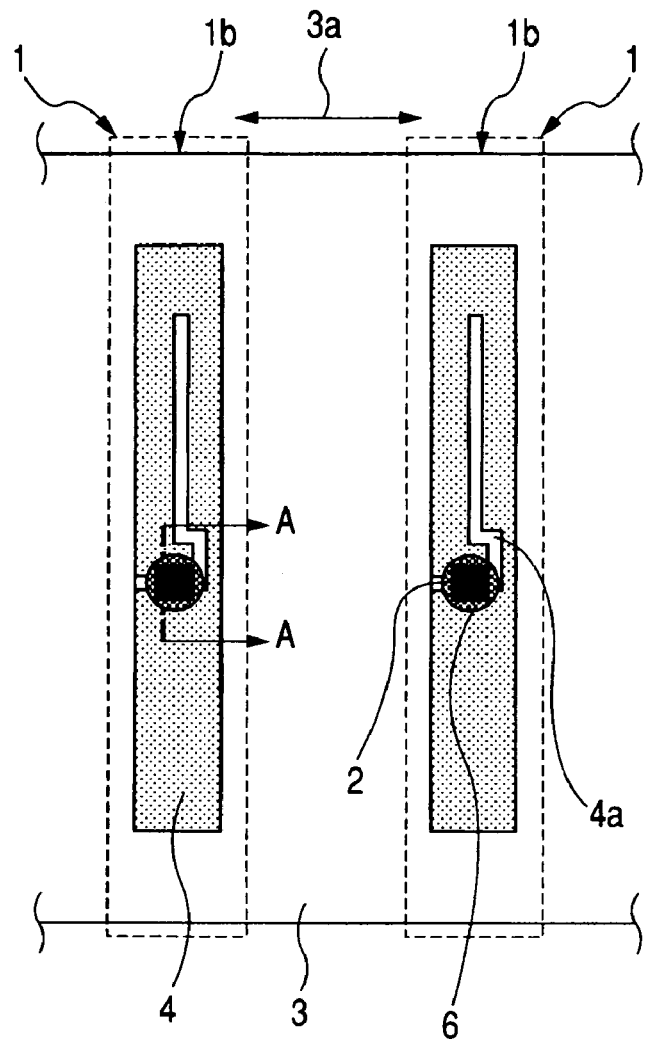
FIG. 4 is a partial plan view showing one example of a structure after underfill sealing in the manufacture of the carrier member for electronic components according to the embodiment of the present invention.
Figure 5:
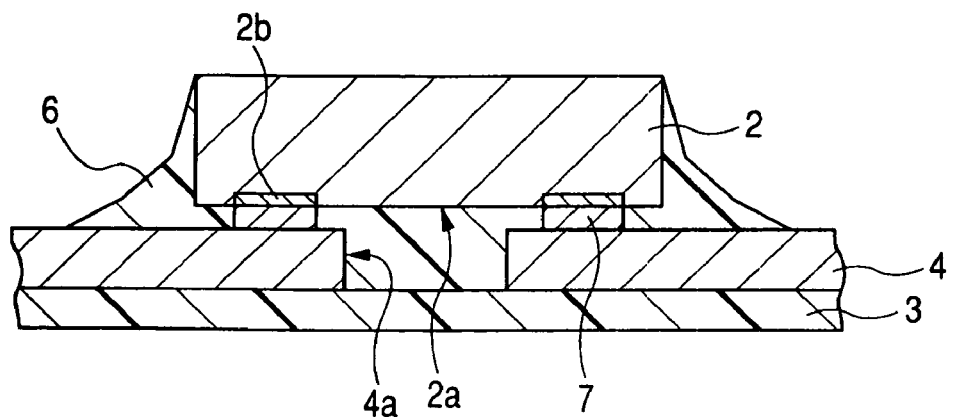
FIG. 5 is a partial sectional view showing a structure of a section cut along a line of A-A in FIG. 4.
Figure 6:
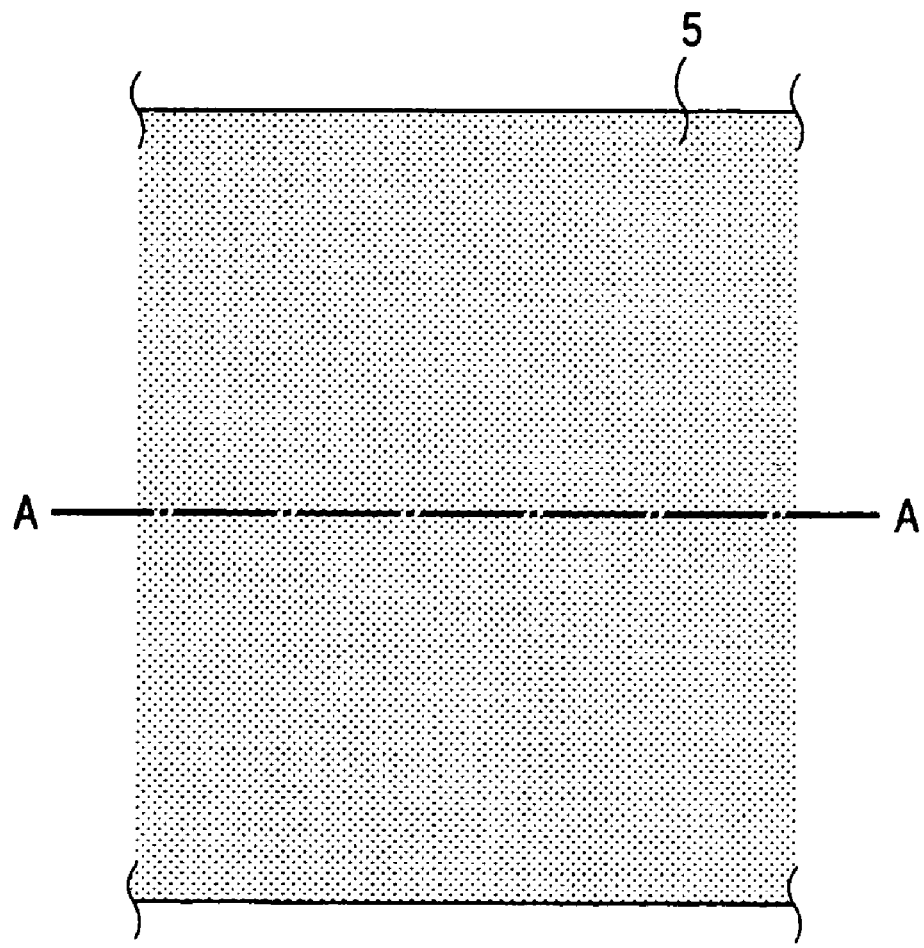
FIG. 6 is a partial plan view showing one example of a structure after a metal foil and tape-like substrate are bonded in the manufacture of the tape-like substrate with an antenna pattern shown in FIG. 1.
Figure 7:
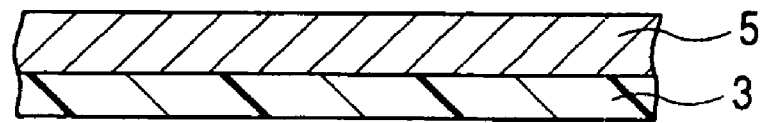
FIG. 7 is a partial sectional view showing a structure of a section cut along a line of A-A in FIG. 6.
Figure 8:
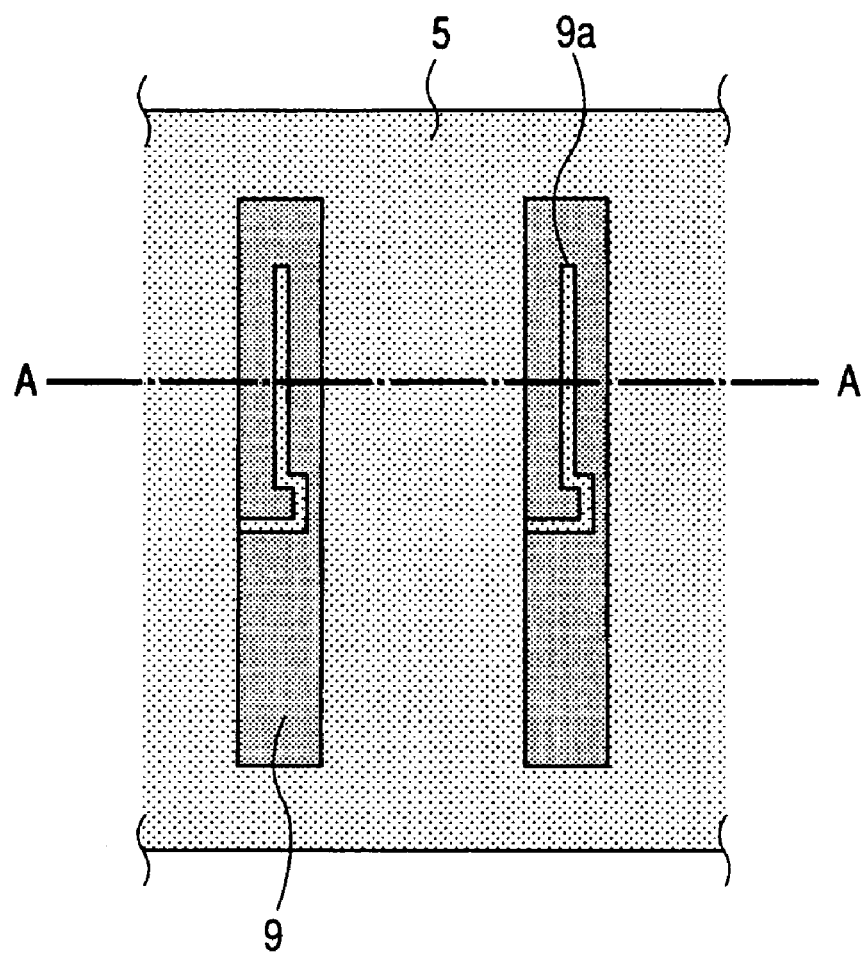
FIG. 8 is a partial plan view showing one example of a structure after a resist is applied in the manufacture of the tape-like substrate with an antenna pattern shown in FIG. 1.
Figure 9:
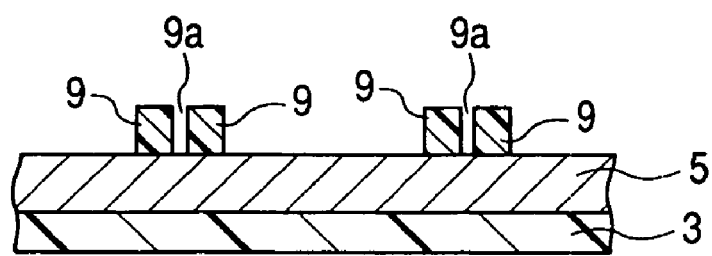
FIG. 9 is a partial sectional view showing a structure of a section cut along a line of A-A in FIG. 8.

FIG. 1 is a partial plan view showing one example of a structure of a tape-like substrate with an antenna pattern prepared for a manufacture of a carrier member for electronic components according to the embodiment of the present invention; FIG. 2 is a partial plan view showing one example of a structure after chips are mounted in the manufacture of the carrier member for electronic components according to the embodiment of the present invention; and FIG. 3 is a partial sectional view showing a structure of a section cut along a line of A-A in FIG. 2. FIG. 4 is a partial plan view showing one example of a structure after underfill sealing in the manufacture of the carrier member for electronic components according to the embodiment of the present invention; FIG. 5 is a partial sectional view showing a structure of a section cut along a line of A-A in FIG. 4; and FIG. 6 is a partial plan view showing one example of a structure after a metal foil and tape-like substrate are bonded in the manufacture of the tape-like substrate with an antenna pattern shown in FIG. 1. FIG. 7 is a partial sectional view showing a structure of a section cut along a line of A-A in FIG. 6; FIG. 7 is a partial plan view showing one example of a structure after a resist is applied in the manufacture of the tape-like substrate with an antenna pattern shown in FIG. 1; and FIG. 9 is a partial sectional view showing a structure of a section cut along a line of A-A in FIG. 8.

Figure 10:
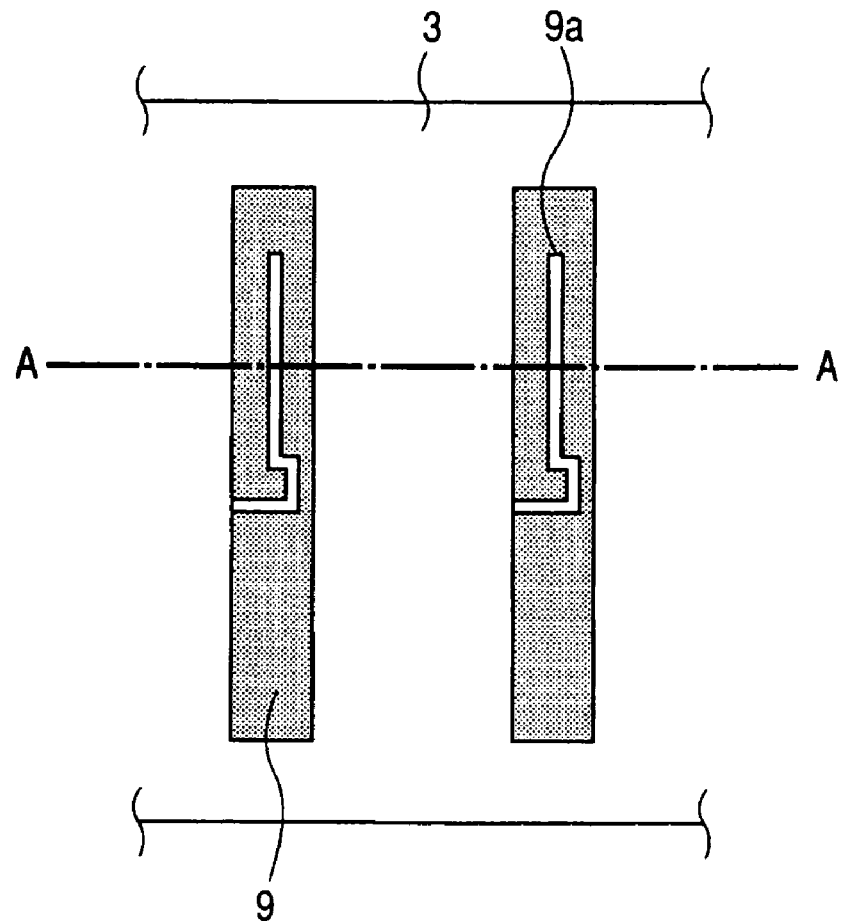
FIG. 10 is a partial plan view showing one example of a structure after the antenna pattern is etched in the manufacture of the tape-like substrate with an antenna pattern shown in FIG. 1.
Figure 11:
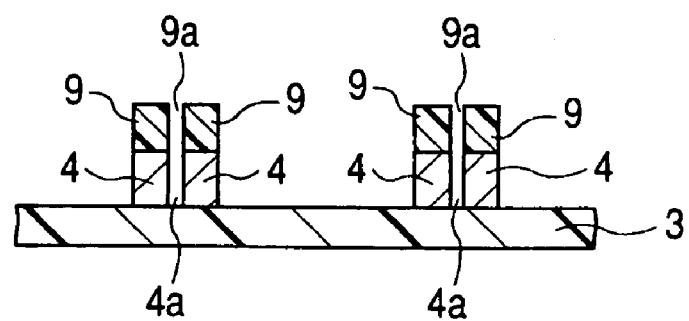
FIG. 11 is a partial sectional view showing a structure of a section cut along a line of A-A in FIG. 10.
Figure 12:
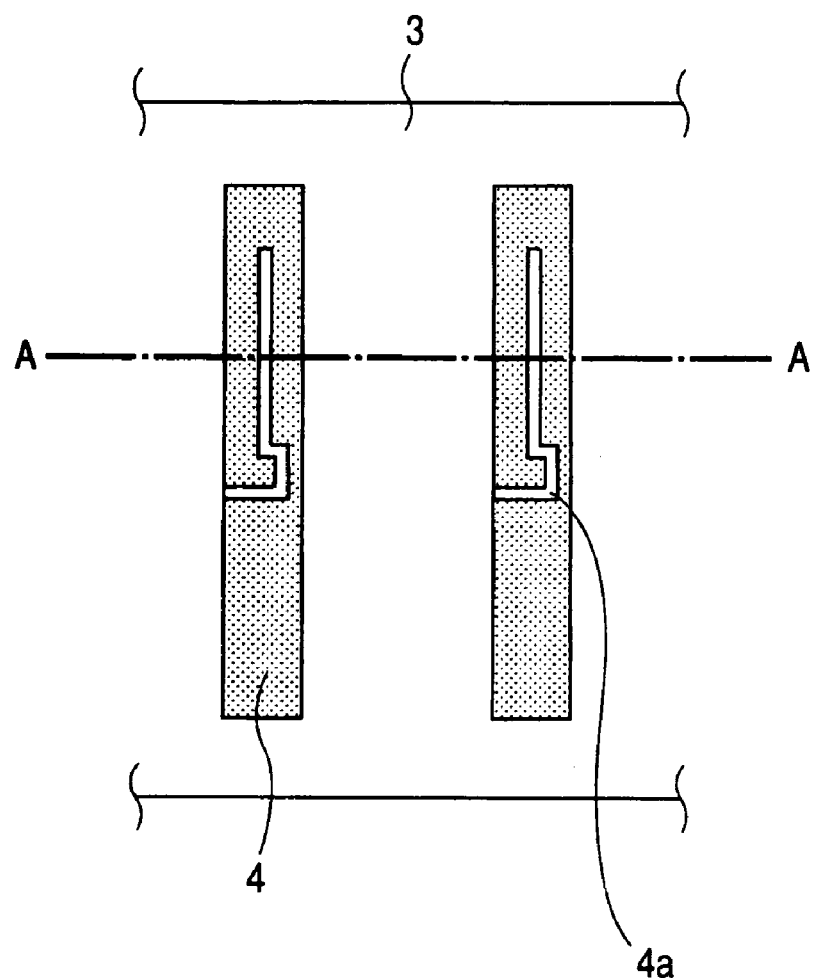
FIG. 12 is a partial plan view showing one example of a structure after the resist is removed in the manufacture of the tape-like substrate with an antenna pattern shown in FIG. 1.
Figure 13:
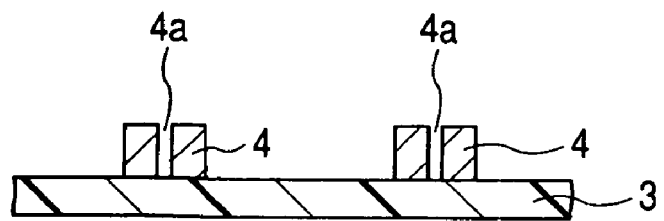
FIG. 13 is a partial sectional view showing a structure of a section cut along a line of A-A in FIG. 12.
Figure 14:
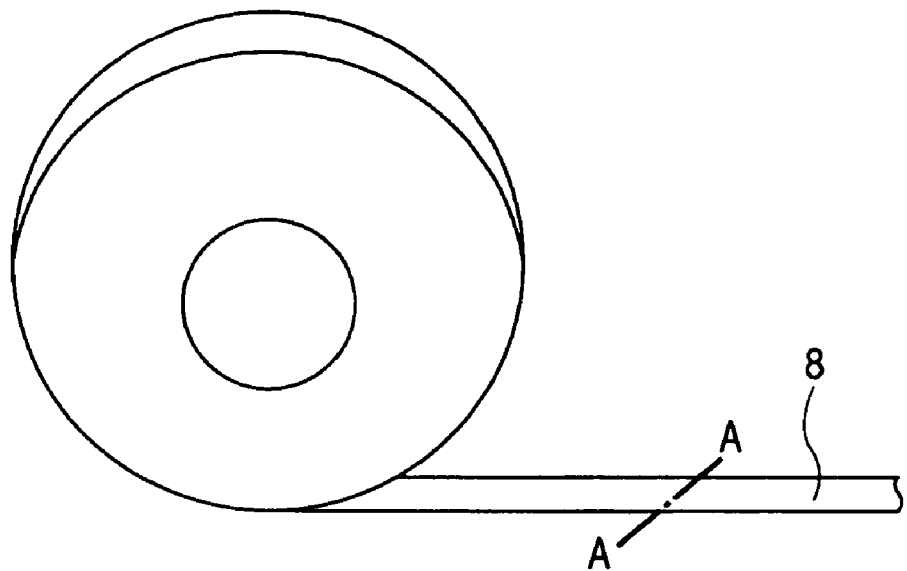
FIG. 14 is a partial perspective view showing one example of a structure of the tape-like carrier used in the manufacture of a carrier member for electronic components according to the embodiment of the present invention.
Figure 15:
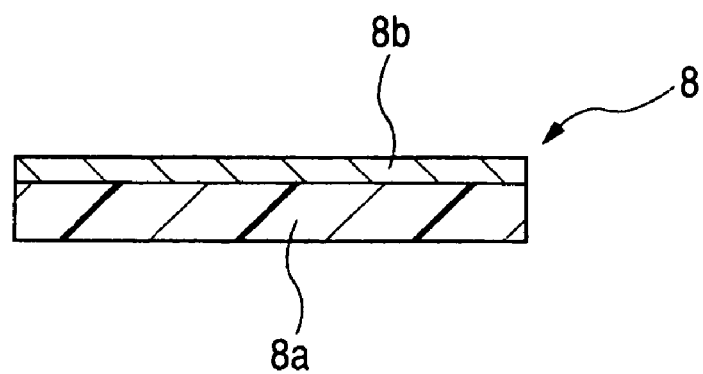
FIG. 15 is a sectional view showing a structure of a section cut along a line of A-A in FIG. 15.
Figure 16:
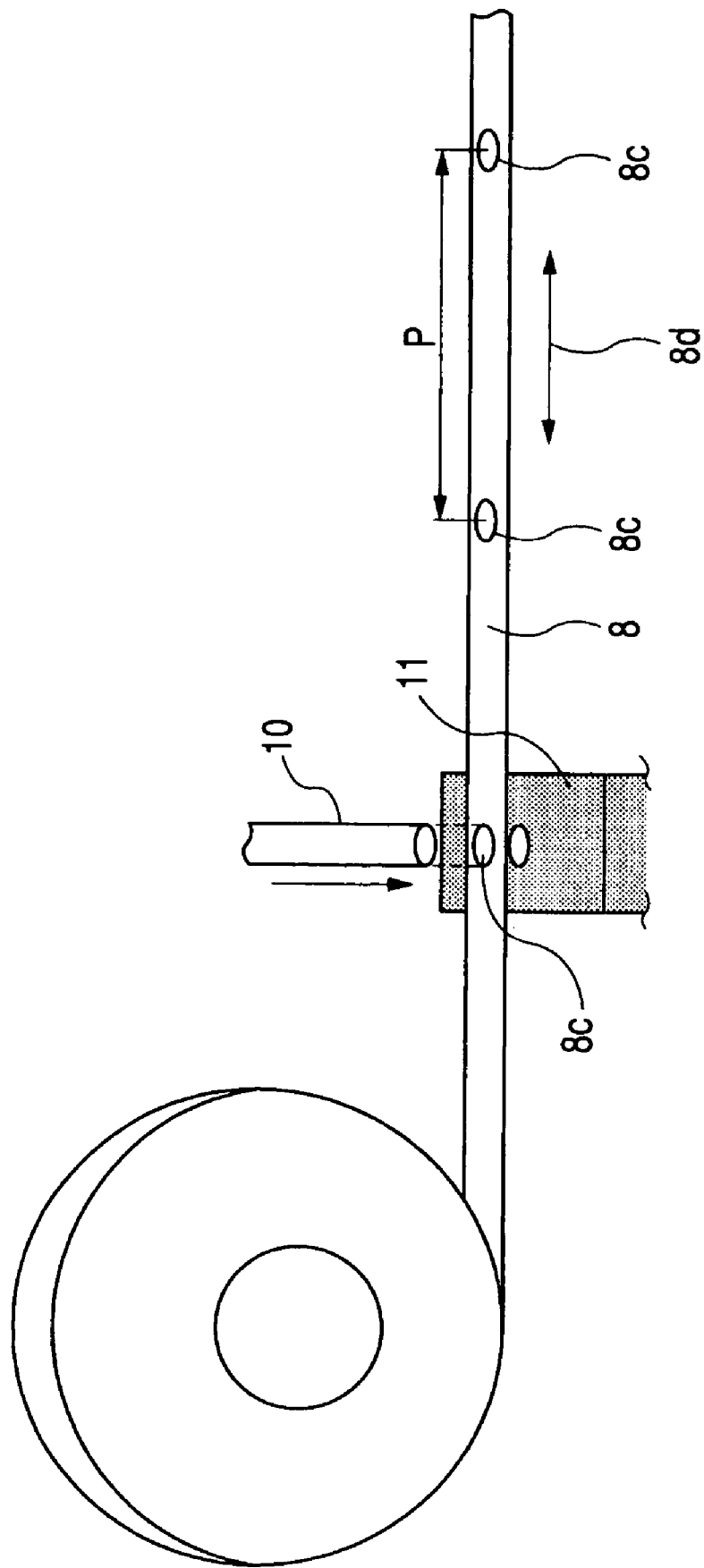
FIG. 16 is a partial perspective view showing one example of a method of forming a hole section to the tape-like carrier in the manufacture of a carrier member for electronic components according to the embodiment of the present invention.
Figure 17:
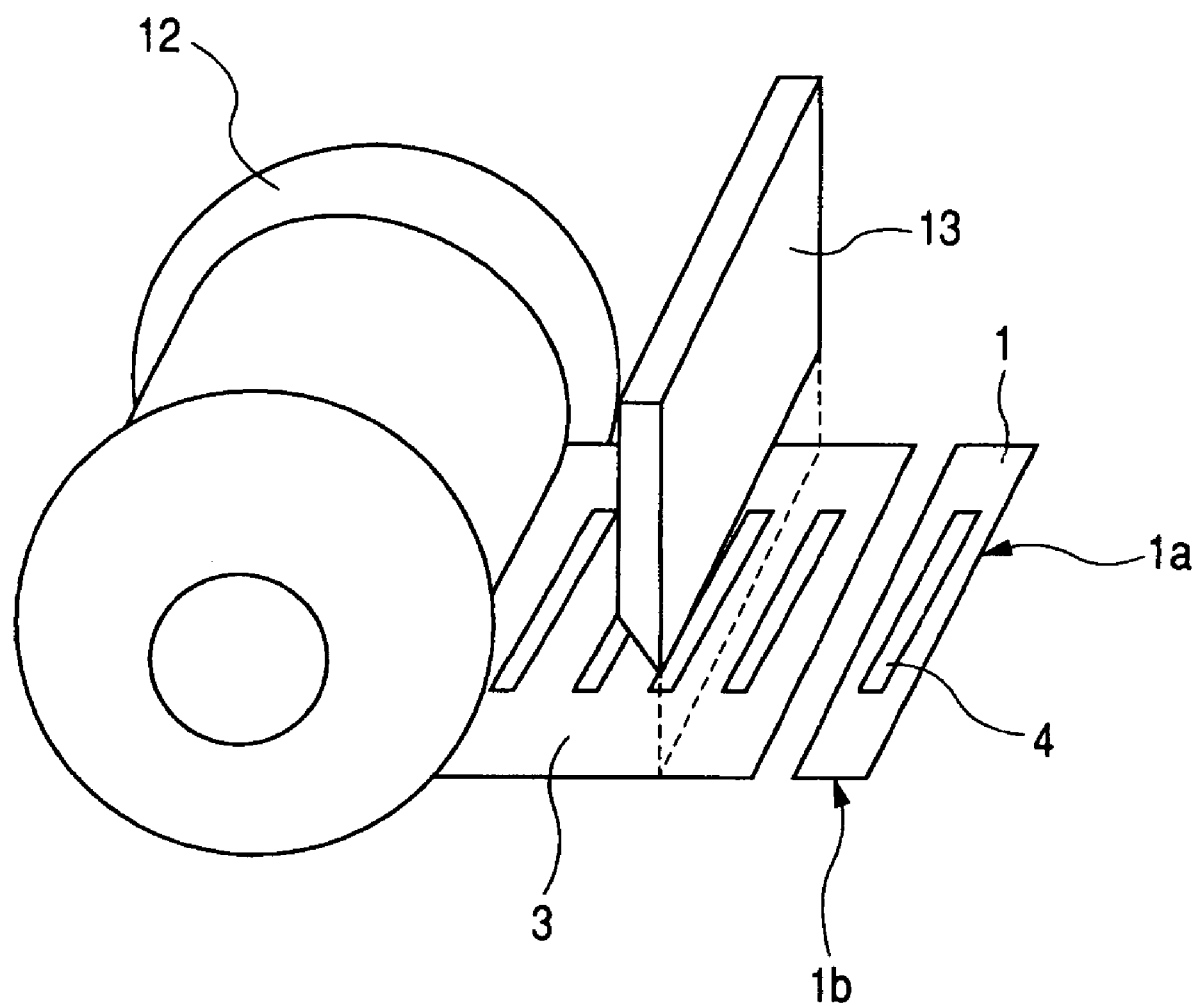
FIG. 17 is a perspective view showing one example of a method of forming plural inlets by dicing in the manufacture of a carrier member for electronic components according to the embodiment of the present invention.

Further, FIG. 10 is a partial plan view showing one example of a structure after the antenna pattern is etched in the manufacture of the tape-like substrate with an antenna pattern shown in FIG. 1; FIG. 11 is a partial sectional view showing a structure of a section cut along a line of A-A in FIG. 10; and FIG. 12 is a partial plan view showing one example of a structure after the resist is removed in the manufacture of the tape-like substrate with an antenna pattern shown in FIG. 1. Further, FIG. 13 is a partial sectional view showing a structure of a section cut along a line of A-A in FIG. 12; FIG. 14 is a partial perspective view showing one example of a structure of the tape-like carrier used in the manufacture of a carrier member for electronic components according to the embodiment of the present invention; and FIG. 15 is a sectional view showing a structure of a section cut along a line of A-A in FIG. 15. Moreover, FIG. 16 is a partial perspective view showing one example of a method of forming a hole section to the tape-like carrier in the manufacture of a carrier member for electronic components according to the embodiment of the present invention; and FIG. 17 is a perspective view showing one example of a method of forming plural inlets by dicing in the manufacture of a carrier member for electronic components according to the embodiment of the present invention.

Figure 18:
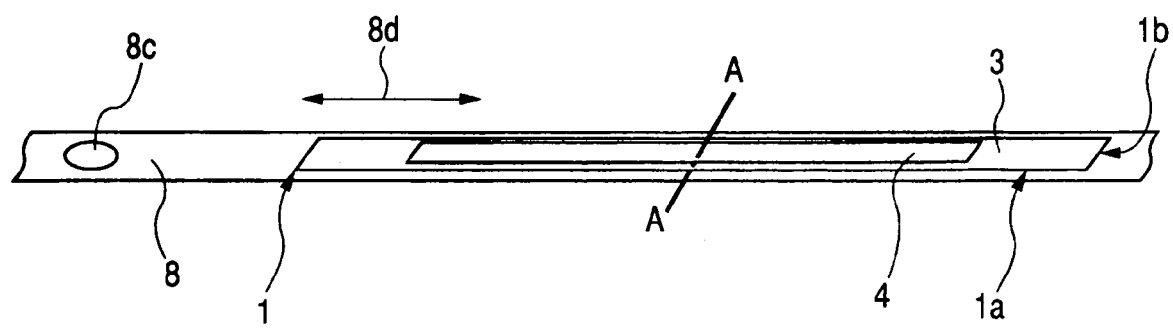
FIG. 18 is a partial perspective view showing one example of a method of mounting the inlet to the tape-like carrier in the manufacture of a carrier member for electronic components according to the embodiment of the present invention.
Figure 19:
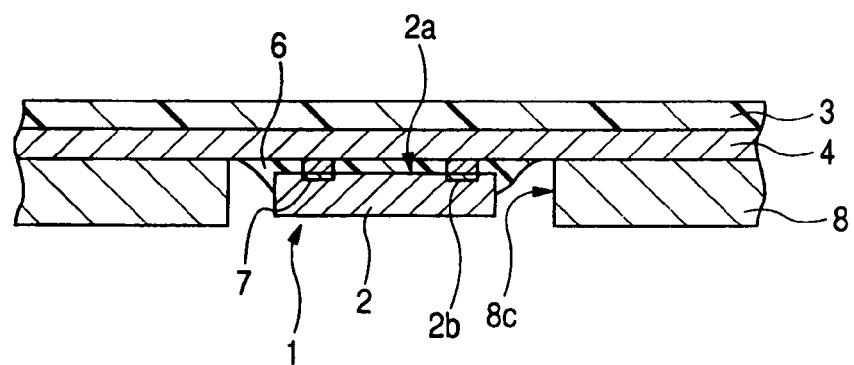
FIG. 19 is a partial sectional view showing a structure of a section cut along a line of A-A in FIG. 18.
Figure 20:
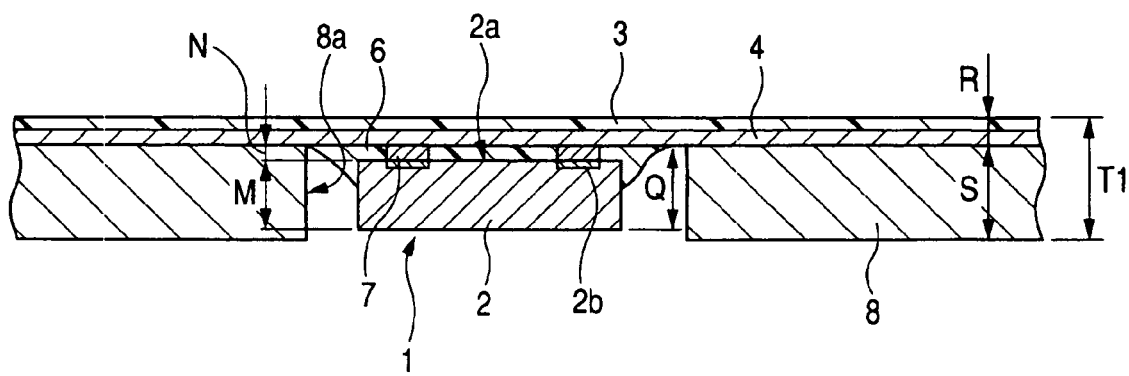
FIG. 20 is a partial sectional view showing one example of a width of each section in the structure shown in FIG. 19.
Figure 21:
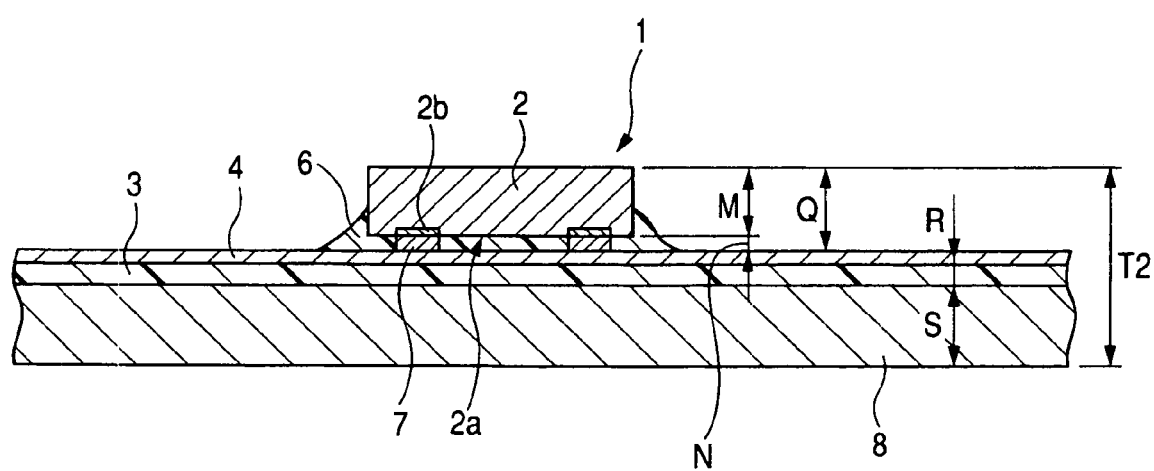
FIG. 21 is a partial perspective view showing one example of a method of mounting the inlet to the tape-like carrier in the manufacture of a carrier member for electronic components according to a modified example of the present invention.
Figure 22:
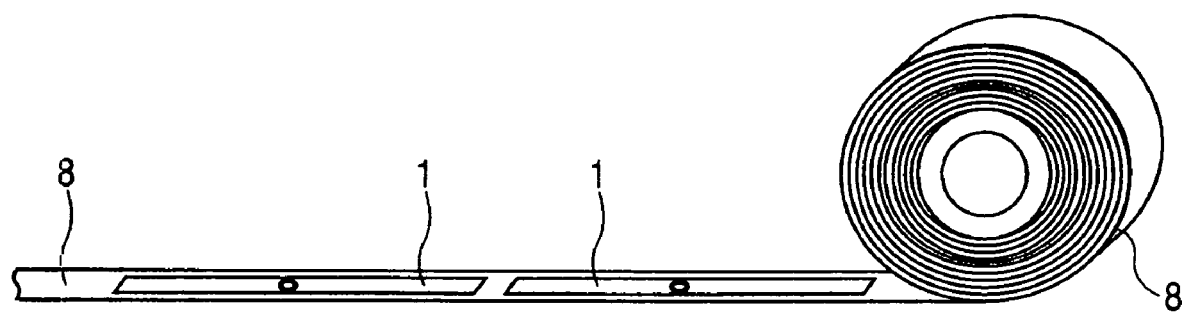
FIG. 22 is a partial perspective view showing one example of a method of winding the tape-like carrier after the inlets are mounted in the manufacture of a carrier member for electronic components according to the embodiment of the present invention.
Figure 23:
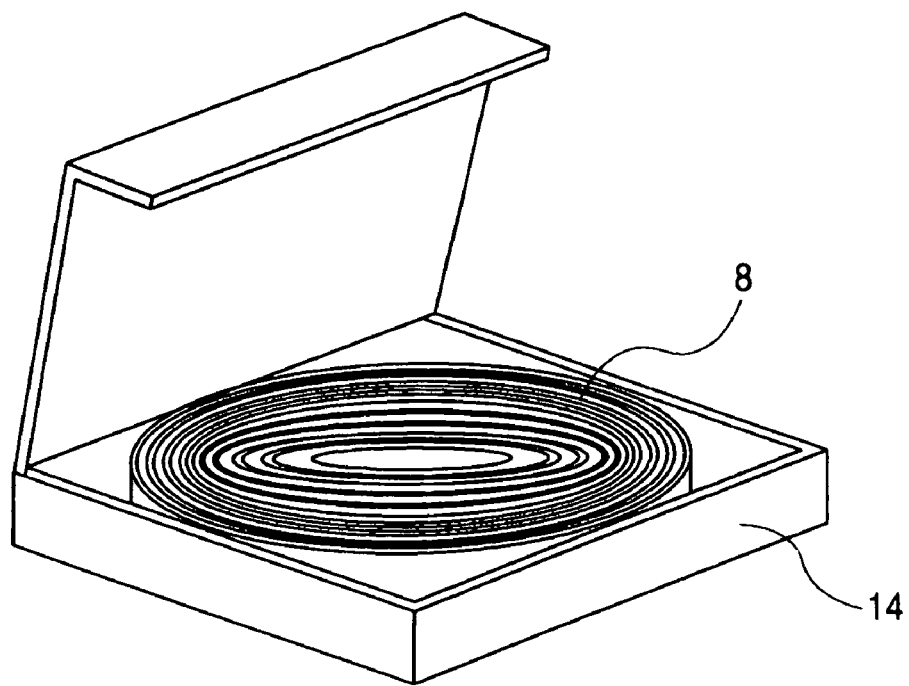
FIG. 23 is a perspective view showing one example of packaging the tape-like carrier wound by the winding method shown in FIG. 22.
Figure 24:
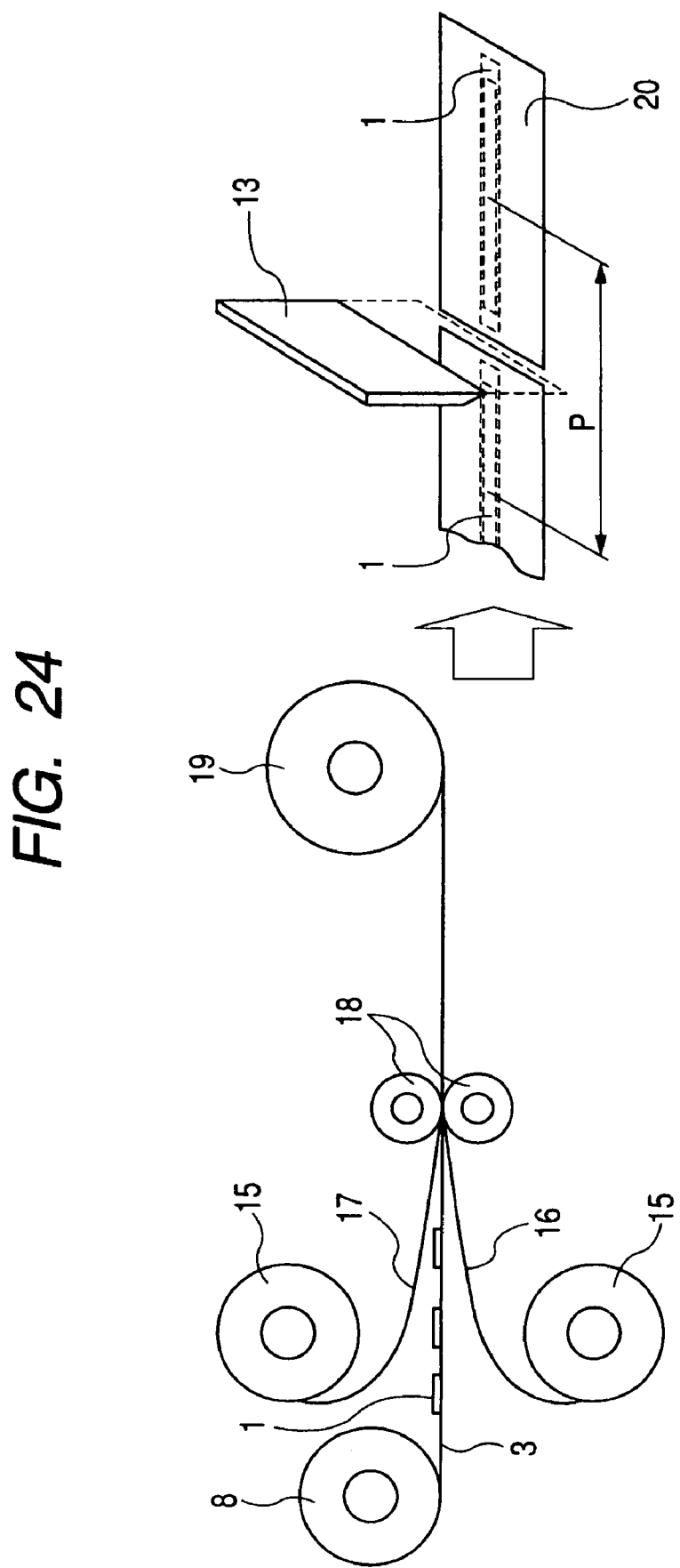
FIG. 24 is a partial perspective view showing one example of a method of manufacturing, at a customer side after shipping, a final product (RFID tag) of the carrier member for electronic components according to the embodiment of the present invention.
Figure 25:
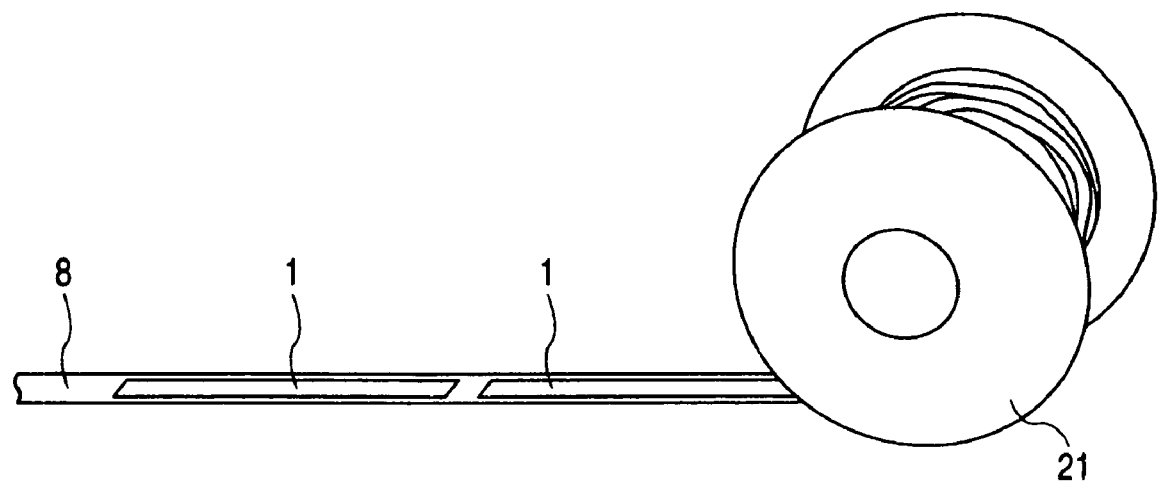
FIG. 25 is a partial perspective view showing a method of winding the tape-like carrier after inlets are mounted in the manufacture of the carrier member for electronic components according to the modified example of the embodiment of the present invention.
Figure 26:
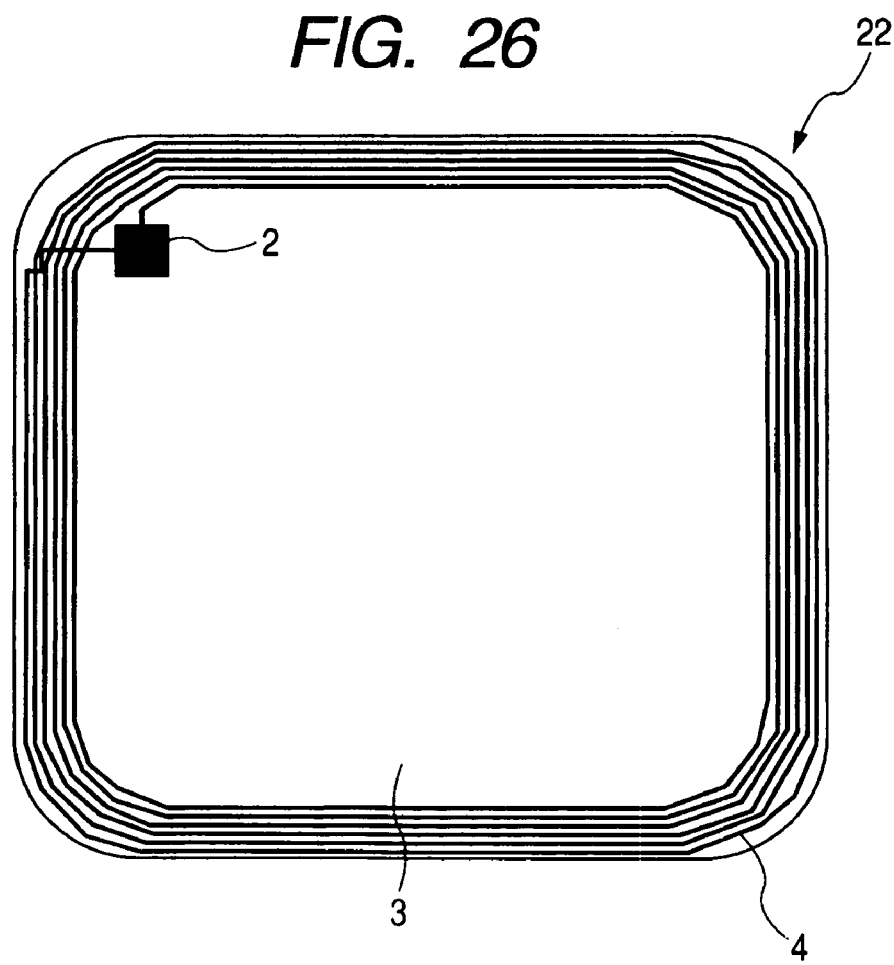
FIG. 26 is a plan view showing the structure of the inlet manufactured by the method of manufacturing the carrier member for electronic components according to the modified example of the embodiment of the present invention.
Figure 27:
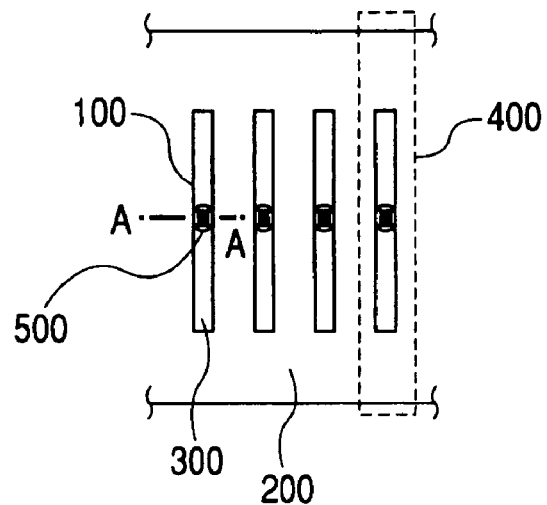
FIG. 27 is a partial plan view of a structure of an inlet according to a comparative example.
Figure 28:
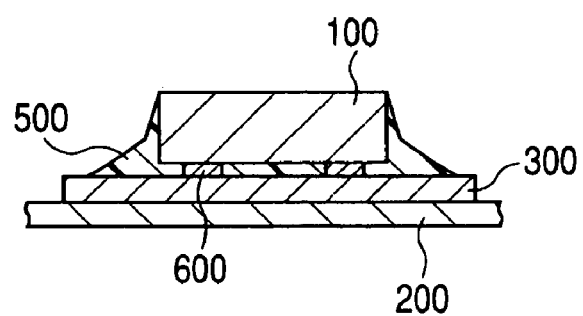
FIG. 28 is a partial sectional view showing a structure of a section cut along a line A-A in FIG. 27.
Figure 29:
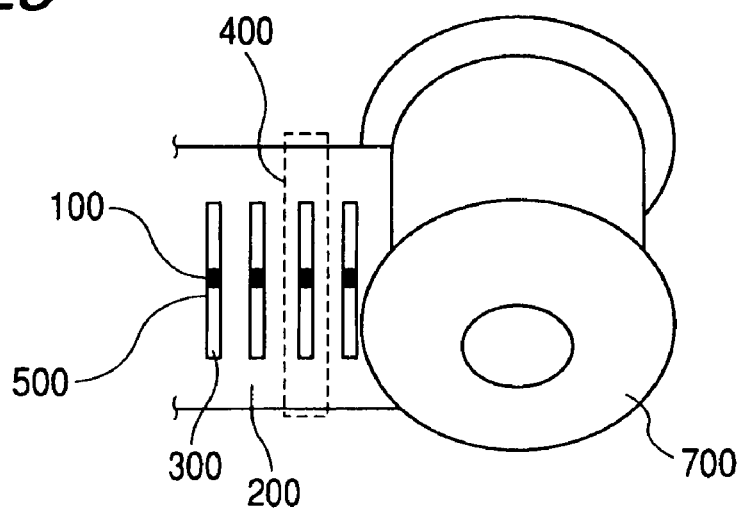
FIG. 29 is a partial perspective view showing a supplying manner of the inlet according to the comparative example shown in FIG. 27.
Figure 30:
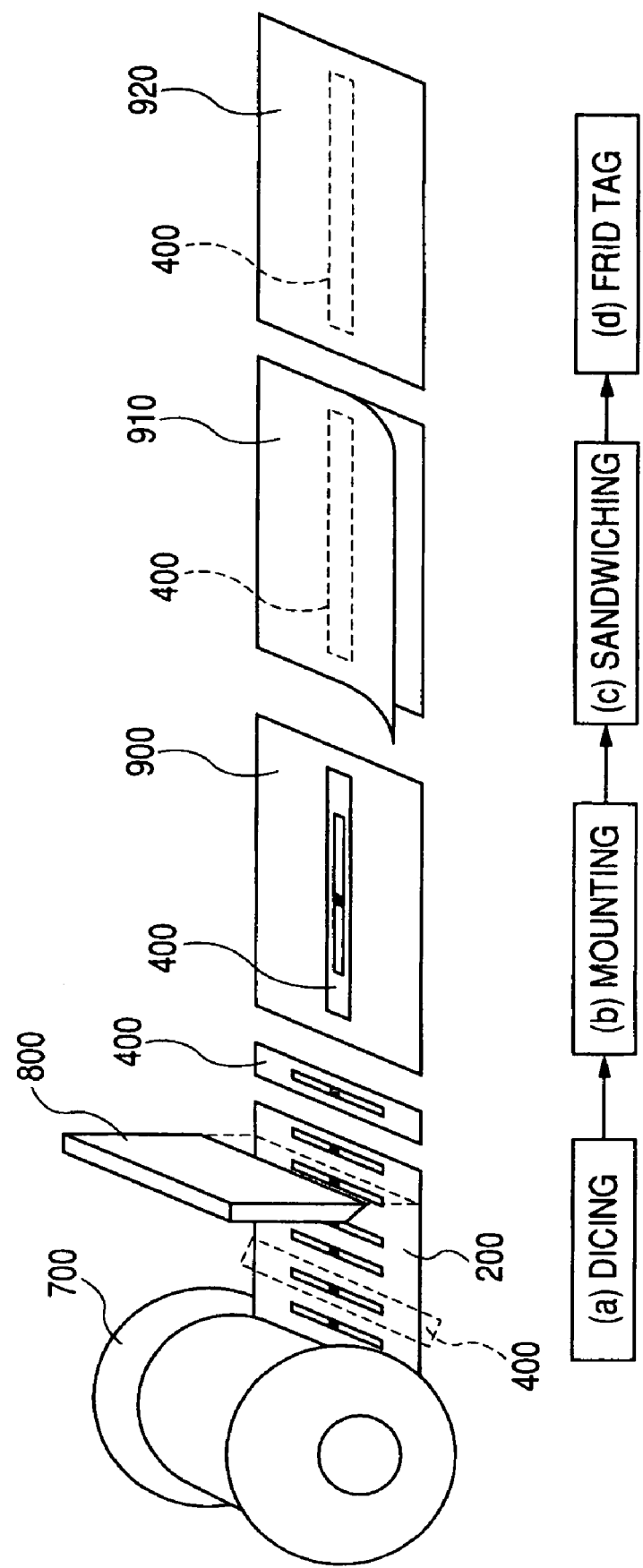
FIG. 30 is a perspective view showing one example of a method of manufacturing a final product (RFID tag) at a customer side after the supply by the supplying manner of the comparative example shown in FIG. 29.
Figure 31:
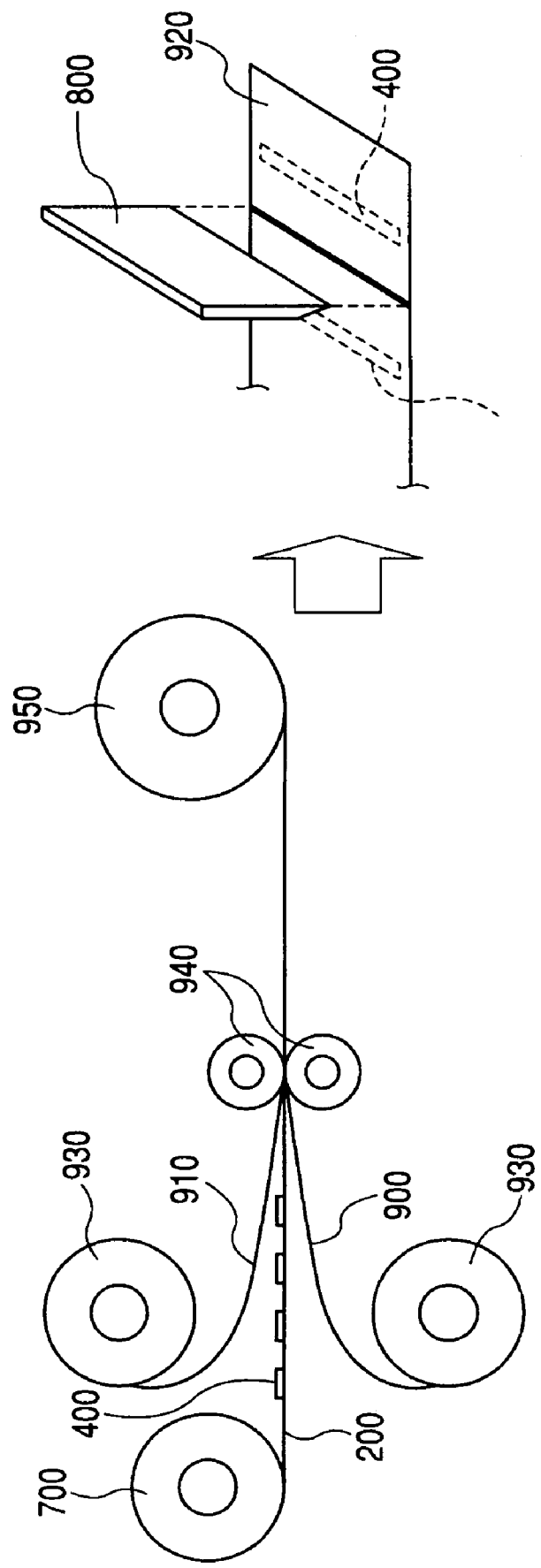
FIG. 31 is a perspective view showing another example of a method of manufacturing a final product (RFID tag) at a customer side after the supply by the supplying manner of the comparative example shown in FIG. 29.

FIG. 18 is a partial perspective view showing one example of a method of mounting the inlet to the tape-like carrier in the manufacture of a carrier member for electronic components according to the embodiment of the present invention; FIG. 19 is a partial sectional view showing a structure of a section cut along a line of A-A in FIG. 18; and FIG. 20 is a partial sectional view showing one example of a width of each section in the structure shown in FIG. 19. FIG. 21 is a partial perspective view showing one example of a method of mounting the inlet to the tape-like carrier in the manufacture of a carrier member for electronic components according to a modified example of the present invention; FIG. 22 is a partial perspective view showing one example of a method of winding the tape-like carrier after the inlets are mounted in the manufacture of a carrier member for electronic components according to the embodiment of the present invention; and FIG. 23 is a perspective view showing one example of packaging the tape-like carrier wound by the winding method shown in FIG. 22. Further, FIG. 24 is a partial perspective view showing one example of a method of manufacturing, at a customer side after shipping, a final product of the carrier member for electronic components according to the embodiment of the present invention; FIG. 25 is a partial perspective view showing a method of winding the tape-like carrier after inlets are mounted in the manufacture of the carrier member for electronic components according to the modified example of the embodiment of the present invention; and FIG. 26 is a plan view showing the structure of the inlet manufactured by the method of manufacturing the carrier member for electronic components according to the modified example of the embodiment of the present invention.

In the method of manufacturing a carrier member for electronic components according to the embodiment, a tape-like carrier 8 shown in FIG. 14 is used as a carrier member for electronic components. As one example of the electronic components, an inlet 1 shown in FIG. 4 and mounted to a non-contact type electronic tag, etc. is taken in the following explanation.

Explaining the structure of the inlet 1 shown in FIGS. 4 and 5, it includes: an insulating base film (tape-like substrate) 3; an antenna pattern 4 composed of a conductive member made of a metal foil or the like formed on the base film 3; and a semiconductor chip 2 that is electrically connected to a pad 2b, that is an electrode, via the antenna pattern 4 and a bump (bump electrode) 7. Further, the main surface 2a, that is a circuit face, of the Semiconductor chip 2 and the joint section of the bump 7—antenna pattern 4 are sealed and protected by an insulating resin 6 for underfill.

The length of the antenna pattern 4 is optimized so as to be capable of efficiently receiving microwave having a frequency of 2.45 GHz or UHF electric wave, for example. A slit 4a whose one end reaches the outer edge of the antenna pattern 4 is formed at its generally central portion. The antenna pattern 4 is made of, for example, a conductive member such as aluminum foil or copper foil.

The semiconductor chip 2 is made of, for example, a silicon substrate. Formed on its main surface 2a is a circuit composed of rectification/sending, clock extraction, selector, counter, ROM (Read Only Memory), and the like. The ROM has a storage capacity of, for example, 128 bits, so that it can store large-capacity data compared to a storage medium such as a bar code.

The base film 3 is a thin-film tape-like substrate made of, for example, PET (Polyethylene Terephthalate), PEN (Polyethylene Naphthalate), or polyimide resin.

The bump 7 is a bump electrode that electrically connects the pad 2b, that is the electrode of the semiconductor chip 2, and the antenna pattern 4. It is made of gold or soldering. The underfill resin 6 is, for example, an epoxy-based sealing resin.

Subsequently, the method of manufacturing a carrier member for electronic components according to the embodiment will be explained.

Firstly, the base film 3 shown in FIG. 1 is prepared that is the tape-like substrate having formed on its surface the antenna pattern 4 made of a conductive member such as an aluminum foil or copper foil.

Here, the base film 3 shown in FIG. 1 is prepared which has plural antenna patterns 4 formed at a same pitch and in which the short side 1b of each inlet 1 is along the longitudinal direction of the base film 3 as shown in FIG. 4. Plural inlets 1 are formed by using this base film 3.

One example of a method of forming the antenna pattern 4 will be explained with reference to FIGS. 6 to 13.

As shown in FIGS. 6 and 7, the tape-like base film 3 is prepared in which a metal foil 5 such as an aluminum foil or the like for the antenna pattern 4 is adhered onto its surface. Then, as shown in FIGS. 8 and 9, a pattern of the resist 9 corresponding to the antenna pattern 4 is formed on the surface of the metal foil 5. Therefore, a slit 9a for forming the slit 4a of the antenna pattern 4 is also formed on the resist 9.

Thereafter, the metal foil 5 is etched with the resist 9 used as a mask. Accordingly, as shown in FIGS. 10 and 11, the metal foil 5 remains only at the lower section of the resist 9. Further, the resist is removed to form the antenna pattern 4 made of the metal foil 5 on the base film 3 as shown in FIGS. 12 and 13.

By this process, the base film 3 shown in FIG. 1 can be prepared in which plural antenna patterns 4 are formed at a same pitch such that the short side 1b of each inlet 1 is along the longitudinal direction 3a of the base film 3.

Then, the antenna pattern 4 and the semiconductor chip 2 are connected via the bump electrode as shown in FIGS. 2 and 3. Here, the pad 2b of the semiconductor chip 2 and the antenna pattern 4 are electrically connected via the bump 7 that is the bump electrode. The connection is made by applying heat, ultrasonic wave, or the like.

Thereafter, as shown in FIGS. 4 and 5, the underfill sealing for filling resin between the semiconductor chip 2 and the antenna pattern 4 is performed to protect the bonded section by the bump 7. In this case, the resin 6 is dropped at the side face of the semiconductor chip 2 to form a fillet, whereby the side face of the semiconductor chip 2 is protected by the resin 6.

After the sealing, the tape-like carrier 8, which is a carrier member for electronic components, shown in FIGS. 14 and 15 is prepared. This tape-like carrier 8 is, for example, an adhesive-adhered paper tape having an adhesive 8b arranged on its one side. It is composed of two layers, i.e., a layer of paper section 8a and a layer of the adhesive 8b. Specifically, the tape-like carrier 8 is preferably made of a paper.

Thereafter, as shown in FIG. 16, plural hole sections 8c are formed on the tape-like carrier 8. Each of the hole sections 8c is a through-hole section 8c that can store the semiconductor chip 2. Further, the plural hole sections 8c are formed at a same pitch by a punching machine after the tape-like carrier 8 is placed on a punching jig 11. It is preferable that the plural hole sections 8c are formed with a pitch (e.g., the pitch P equal to the arrangement pitch P of the final product such as an RFID tag 20 shown in FIG. 24) equal to the pitch upon mounting the inlet to a final product (e.g., a ticket, or the like) at a customer side. With this structure, plural inlets 1 can be rearranged onto the tape-like carrier 8 with the pitch corresponding to the pitch upon mounting the inlet at a customer side.

Then, as shown in FIG. 17, the base film wound around a reel 12 for supplying the inlet is drawn out, and the base film 3 is cut for every inlet 1 with the use of a cutting edge 13. Accordingly, plural inlets 1 that are separated into individual pieces are formed.

Then, as shown in FIG. 18, plural inlets 1 are arranged on the tape-like carrier 8 such that each long side 1a of each of the plural inlets 1 is along the longitudinal direction 8d of the tape-like carrier 8, and then, the adhesive 8b of the tape-like carrier 8 and the antenna pattern 4 of the inlet 1 are bonded to each other.

Specifically, plural inlets 1 that are separated into individual pieces are rearranged and bonded to the tape-like carrier 8, which is a carrier member for electronic components, at the same pitch.

In this case, as shown in FIG. 19, the semiconductor chip 2 of each of the plural inlets 1 that are separated into individual pieces is stored in each of the plural hole sections 8c on the tape-like carrier 8 as positioned, whereupon the plural inlets 1 are bonded to the tape-like carrier 8. Since the plural hole sections 8c are formed so as to correspond to the pitch upon mounting the inlet to the final product at the customer side, the plural inlets 1 can be rearranged to the tape-like carrier 8 with the pitch corresponding to the pitch upon mounting the inlet at the customer side by storing the semiconductor chip 2 into the hole section 8c.

Supposing that the thickness (M) of the semiconductor chip 2 is 150 μm, the thickness (N) of the bump 7 is 10 μm, the total thickness (R) of the base film 3 and the antenna pattern 4 is 50 μm, and the thickness (S) of the tape-like carrier 8 is 160 μm as shown in FIG. 20. In the case where the semiconductor chip 2 is stored in the hole section 8c of the tape-like carrier 8, the total thickness (T1) becomes 210 μm, which is the same as the thickness of the inlet 1 (M+N+R).

It should be noted that the total of the thickness (M) of the semiconductor chip 2 and the thickness (N) of the bump 7 may be smaller than the thickness (S) of the tape-like carrier 8.

Further, as shown in FIG. 21, the hole sections 8c are not necessarily formed on the tape-like carrier 8. In this case, the total thickness (T2.) becomes 370 μm.

Further, the width of the tape-like carrier 8 is, for example, about 5 to 30 mm, and the hole section 8c formed thereon has a diameter of, for example, 2 mm, in the case where the stored semiconductor chip 2 is a square of 0.5×0.5 mm.

After the inlet 1 is bonded (affixed) to the tape-like carrier 8, the tape-like carrier 8 is wound into a roll by a record-winding method as shown in FIG. 22. It should be noted that the supply amount of the winding of the tape-like carrier 8 with the record-winding method is, for example, about 500 to 3000 m.

Then, as shown in FIG. 23, the tape-like carrier 8 wound into a roll is put into a shipment box 14, and shipped to a customer.

FIG. 24 shows one example of a method (sandwiching process) of making the inlet-mounted tape-like carrier 8 shipped to the customer by this method into a final product (e.g., RFID tag 20) at the customer.

The individual inlet 1 drawn out as mounted to the tape-like carrier 8 that is wound into a roll is inserted, as communicated with each other by the base film 3, between the tag paper (lower side) 16 and the tag paper (upper side) 17 supplied from the paper roll 15, and the whole is bonded with an adhesive or the like by using a pressure roller 18, etc. Then, the resultant is wound into a roll around an RFID tag roll 19, or separated into individual pieces by the cutting edge 13 for every product, to thereby made into, for example, the RFID tag 20.

In this case, in the tape-like carrier 8 wound into a roll at the shipment, plural inlets 1 are arranged on the tape-like carrier 8 with the pitch P corresponding to the pitch upon mounting the inlet to the final product at the customer side, whereby the customer can easily mount the inlet 1 to the RFID tag 20 (final product). As a result, the mountability of the inlet 1 by the customer can be enhanced.

The method of winding the tape-like carrier 8 on which the inlet has already been bonded is not limited to the record-winding method. A traverse-winding process shown in the modified example in FIG. 25 may be employed. Specifically, after the plural inlets 1 are bonded to the tape-like carrier 8, the tape-like carrier 8 is wound around a reel 21 with a traverse-winding, and then, the tape-like carrier 8 is shipped as wound around the reel 21.

In the case where the tape-like carrier 8 is wound with a traverse-winding, it is possible to provide an amount, that can be supplied with one roll, of 10000 m or more, for example. Since the original length of the paper such as the tag paper is 10000 m or more, in general, the length of 10000 m or more of the inserted tape-like carrier 8 on which the inlet 1 is bonded is similarly required in the sandwiching process shown in FIG. 24.

It is difficult to hold the shape when the tape-like carrier 8 is wound in extremely long in the record-winding method. However, in the traverse-winding method, the reel 21 for the traverse-winding can be formed with a size according to need, whereby 10000 m or more of the tape-like carrier 8 having bonded thereon the inlet 1 can be wound. Accordingly, the tape-like carrier 8 having bonded thereto the inlet 1 in this embodiment can easily be handled in a tag processing manufacturer or paper-making manufacturer.

Subsequently, the inlet (electronic component) 22 shown in FIG. 26 is an inlet according to the modified example of this embodiment. The inlet 22 has a planar shape of generally square. The schematic structure of the inlet 22 separated into individual pieces is generally the same as that of the inlet 1. The antenna pattern 4 is formed on the base film 3, and the semiconductor chip 2 that is electrically connected to the antenna pattern 4 is mounted. The different point from the inlet 1 is the frequency of the microwave, e.g., 13.56 MHz, handled by the inlet 22, and therefore, the antenna pattern 4 is arranged in a coil form, in which the antenna pattern 4 are wound plural times, at the peripheral edge portion of the inlet 22.

Even in the inlet 22 having the planar shape of generally square, the plural inlets 22 that are formed by separating into individual pieces are bonded (rearranged) on the tape-like carrier 8 with the pitch corresponding to the pitch upon mounting the inlet to the final product by the customer side, whereby the customer can easily mount the inlets 22 to the final product. As a result, the mountability of the inlets 22 by the customer can be enhanced. Further, the other effects similar to those of the inlet 1 can be obtained.

According to the method of manufacturing a carrier member for electronic components according to this embodiment, plural inlets 1 are formed, and they are arranged on the tape-like carrier 8 such that each long side 1a of each of the plural inlets 1 is along the longitudinal direction 8d of the tape-like carrier 8, whereby cost can be reduced by rearranging the inlets 1 onto the cheap tape-like carrier 8.

Since the tape-like carrier is made of a paper, the manufacturing cost of the carrier can sufficiently be reduced.

Since the plural inlets 1 and 22 are rearranged on the tape-like carrier 8, the change of the arrangement pitch of the inlets 1 and 22 so as to correspond to the size of the final product (RFID tag 20) at the customer side can be facilitated, and consequently, the days taken for the development for newly supplying the inlets 1 and 22 can be shortened.

Each of the semiconductor chips 2 of the inlets 1 and 22 is stored in the plural hole sections 8c formed on the tape-like carrier 8 and the plural inlets 1 and 22 are arranged on the tape-like carrier 8, whereby the inlets 1 and 22 can be transported with the carrier without increasing the total thickness of the inlets 1 and 22 and the tape-like carrier 8.

The semiconductor chip 2 of the inlets 1 and 22 is stored in the hole sections 8c of the tape-like carrier 8, whereby the semiconductor chip 2 does not project from the carrier 8. Therefore, the concentrate application of stress on the semiconductor chip 2 upon the transportation can be prevented.

As a result, the semiconductor chip 2 can be prevented from being damaged upon carrying the inlet.

When the inlets 1 and 22 are carried and shipped by using the tape-like carrier 8 according to the present embodiment, a tag processing manufacturer or paper-making manufacturer can manufacture the final product such as the RFID tag 20 with reduced cost by using a general technique, which contributes to expansion of market of the RFID tag 20.

The invention made by the inventors was specifically explained above with reference to the embodiments. The present invention is not limited to the aforesaid embodiments. Various modifications are of course possible without departing from the spirit of the present invention.

For example, the through hole sections 8c are formed on the tape-like carrier 8, and the semiconductor chip 2 is stored in each of the hole sections 8c in the aforesaid embodiment. However, a groove portion or recess portion that does not penetrate may be formed instead of the hole sections 8c. For example, the semiconductor chip 2 can be stored in the groove section or recess portion that is formed by a crush.

Although the aforesaid embodiment explains the case in which the tape-like carrier 8 is made of a paper, the tape-like carrier 8 may be made of a cheap material other than a paper, such as PET, or the like.

The present invention is preferable for a technique for manufacturing a carrier member for electronic components.

What is claimed is:

1. A method of manufacturing a carrier member for electronic components, comprising the steps of:
    (a) forming plural inlets; and
    (b) arranging the plural inlets to a tape-like carrier
    wherein each of the plural inlets which has a semiconductor chip, and an antenna pattern formed of a conductive member connected to an electrode of the semiconductor chip;
    wherein the tape-like carrier has hole sections or groove sections that can store the semiconductor chip of the inlet;
    wherein the hole sections or groove sections are formed so as to correspond to the pitch upon mounting the inlet to the final product at the customer side;
    wherein in the step (b), the semiconductor chip of each of the plural inlets that are separated into individual pieces is stored in each of the plural hole sections or groove sections on the tape-like carrier, whereupon the plural inlets are bonded to the tape-like carrier.

2. A method of manufacturing a carrier member for electronic components according to claim 1, wherein the step (a) includes the steps of: arranging the plural inlets to the tape-like substrate; and cutting the tape-Like substrate for every inlet for separating into individual pieces.

3. A method of manufacturing a carrier member for electronic components according to claim 1, wherein after the step (b), the tape-like carrier is wound around a reel, and then, the tape-like carrier is shipped as wound around the reel.

4. A method of manufacturing a carrier member for electronic components according to claim 3, wherein the tape-like carrier is wound by a traverse-winding method when the tape-like carrier is wound around the reel.

5. A method of manufacturing a carrier member for electronic components according to claim 1,
wherein the tape-like carrier is made of a paper.

6. A method of manufacturing a carrier member for electronic components according to claim 1,
wherein a total of the thickness of the semiconductor chip and a thickness of a bump of the electrode of the semiconductor chip is smaller than a thickness of the tape-like carrier.

* * * * *